(12) United States Patent
Beaulieu

(10) Patent No.: US 6,362,670 B1
(45) Date of Patent: Mar. 26, 2002

(54) CONTROLLED SLEW REFERENCE SWITCH FOR A PHASE LOCKED LOOP

(75) Inventor: Rejean Beaulieu, Mercier (CA)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/632,952

(22) Filed: Aug. 4, 2000

(51) Int. Cl.[7] .................................................. H03L 7/06
(52) U.S. Cl. ....................................... 327/156; 327/159
(58) Field of Search ................................. 327/147, 150, 327/151, 156, 159, 160, 175, 179, 113

(56) References Cited

U.S. PATENT DOCUMENTS

| 5,254,955 A | | 10/1993 | Saeki et al. ................... 327/156 |
| 5,877,656 A | * | 3/1999 | Mann et al. .................... 331/16 |
| 6,037,814 A | * | 3/2000 | Hirakawa .................... 327/156 |
| 6,188,255 B1 | * | 2/2001 | Mann .......................... 327/113 |

* cited by examiner

Primary Examiner—Tuan T. Lam
Assistant Examiner—Hiep Nguyen
(74) Attorney, Agent, or Firm—Jones, Day, Reavis & Pogue

(57) ABSTRACT

A controlled slew reference switch circuit is provided for limiting the phase deviation of a phase locked loop (PLL) output signal in response to the PLL switching between a plurality of input reference clock signals. The PLL includes a phase detector for measuring the phase deviation between two input signals. The controlled slew reference switch circuit includes a transfer function generator that controls one or more selector circuits for operating the PLL in a normal mode of operation and a holdover mode of operation. In the normal mode of operation the PLL is locked to one of the reference clock signals, and the phase detector inputs are coupled to the reference clock signal and a PLL feedback signal. In the holdover mode of operation both inputs of the phase detector are coupled to the PLL feedback signal, thereby holding the PLL in its last operational state. By controlling the amount of time that the PLL operates in the holdover mode versus the normal mode of operation, the controlled slew reference switch circuit controls the gain of the PLL and thereby limits the phase deviation of the PLL output signal.

22 Claims, 5 Drawing Sheets

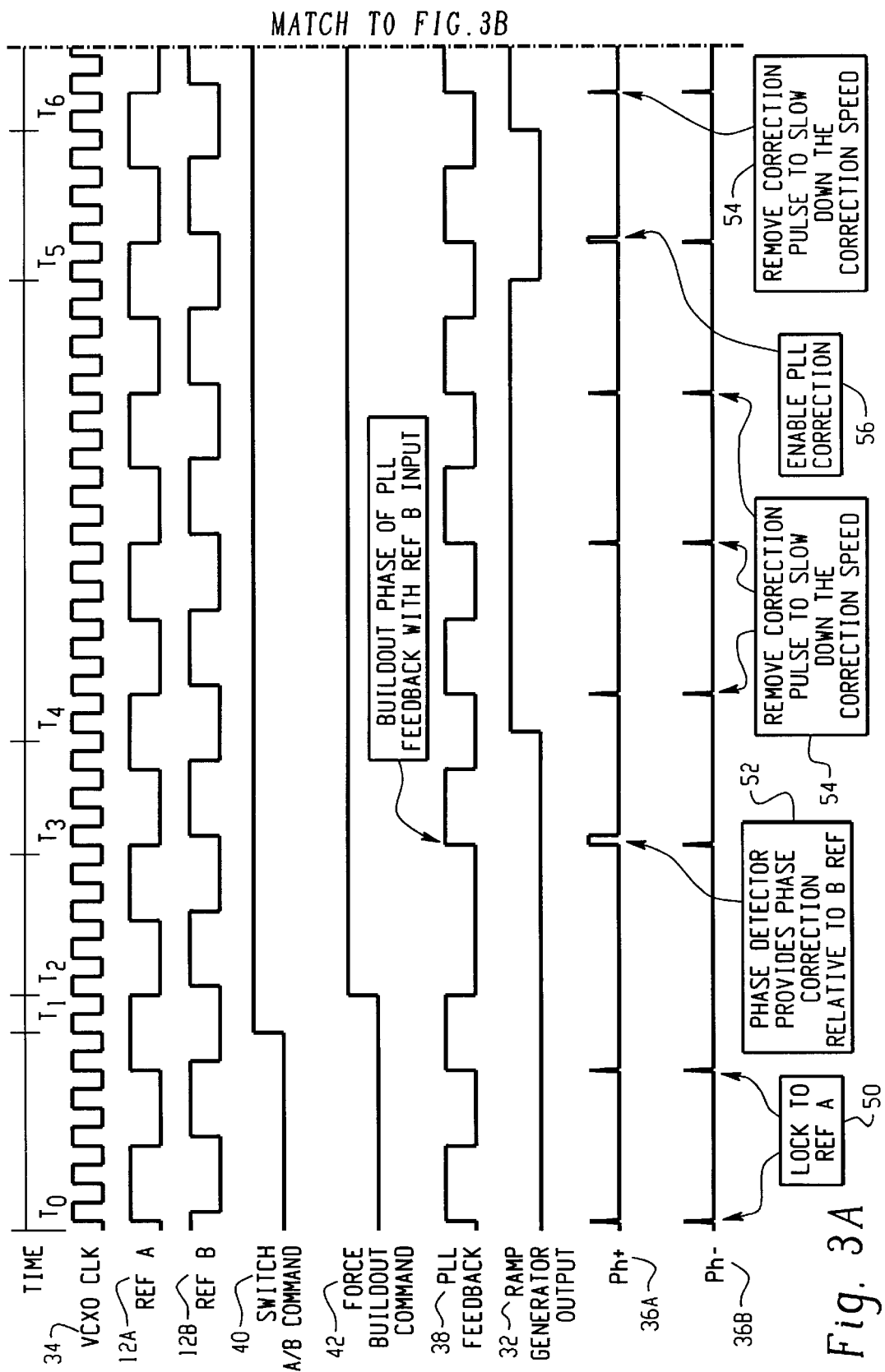

CONTROLLED SLEW REFERENCE SWITCH FOR A PHASE LOCKED LOOP

BACKGROUND OF THE INVENTION

1. Technical Field

The present invention is directed to the field of phase locked loops. More specifically, the invention provides an improved phase locked loop ("PLL") having a controlled slew reference switch for controlling the phase deviation in the PLL output signal when the PLL switches from a primary input reference signal to a backup input reference signal.

2. Description of the Related Art

Phase locked loops are well-known elements in analog and digital circuit design. A phase locked loop operates by receiving an input reference clock signal and generating a localized oscillator signal that is synchronized with the reference clock signal. The local oscillator signal that is output from the PLL may operate at the same frequency as the reference clock signal or at some integer multiple of that frequency. A general description of the theory and operational characteristics of a PLL is contained in Couch, *Digital and Analog Communication Systems*, Fourth Edition, pp. 289–296.

FIG. 1 is a circuit diagram of a known PLL circuit 10A. This circuit 10A includes four primary elements—a phase detector 14, an integrator 16, a voltage controlled oscillator (VCXO) 18, and a counter 26. This circuit 10A generates a local oscillator signal (PLL clock) 34 that is synchronized with an input reference clock signal 12, but which operates at a higher frequency than the reference clock 12. This is accomplished by feeding back a divided down version 38 of the local oscillator signal 34 to the phase detector 14, which then compares the phases of the reference clock signal 12 with the feedback signal 38.

The phase detector 14 compares the phases of the signals at its two inputs, and generates output pulse signals having pulse widths that correspond to the phase difference between the two input signals. These output pulse signals are then coupled to the integrator 16. The integrator 16 receives the pulses from the phase detector outputs and generates a voltage level at its output that is proportional to the pulse width of the phase pulses. This phase voltage is then provided as an input to the voltage controlled oscillator (VCXO) 32.

The voltage controlled oscillator 32 generates an output clock signal, PLL clock 34, which is characterized by a frequency that is proportional to the phase voltage from the integrator 16. This clock signal, PLL clock 34, is the localized oscillator signal that is synchronized with the reference clock 12. The PLL clock signal 34 is then fed back to one of the inputs of the phase detector 14 either directly, or via a counter 26.

The counter 26 is configured as a divide-by-N counter and it generates the PLL feedback signal 38, which is a frequency divided version of the PLL clock signal 34. By selecting an appropriate value of N, a circuit designer can select the frequency of the PLL clock signal 34 with respect to the external reference clock 12. For example, if the circuit designer desires to generate a synchronized version of the reference clock signal 12, but at a frequency 10 times greater than the reference clock signal 12, then the value of N would be 10.

In distributed communication systems, such as SONET/SDH networks that include a plurality of network elements coupled via fiber optic connections, there is often a need to distribute more than one reference clock to the various network elements in order to ensure synchronization of these elements. Typically, a system may include a primary input reference clock (which is used in normal operation) and a backup input reference clock (which is used when the primary clock fails.) These reference clocks typically exhibit independent phase characteristics due to the wander generated by each individual clock.

A PLL circuit is typically used to carry out this synchronization step. The PLL preferably locks onto the primary input reference clock. If the primary reference clock fails, however, then the PLL must lock onto the backup reference signal. But because of the independent phase characteristics of the two reference signals, this switch-over often results in a sudden reaction in the phase of the PLL output signal.

The problem with this sudden reaction by the PLL is that in certain telecommunication systems, such as the SONET/SDH systems noted above, there is a requirement that limits the reaction speed of such a PLL circuit under these conditions. One reason for this reaction speed requirement is that in such systems one PLL circuit may be feeding other PLL circuits in other parts of the system, which may in turn be feeding still other PLL circuits. If one of the PLLs in this chain of PLLs reacts too quickly, then the phase variation in its output signal may cause other PLLs (or clock recovery mechanisms) in the chain to become unlocked to their respective reference signals.

A typical solution to this problem is to slow down the loop bandwidth of the PLL so that in reaction to the switch-over from the primary to the backup reference clock, the loop does not violate the reaction speed requirement. This solution, however, degrades the locking ability of the PLL under certain conditions, such as under temperature variations, and therefore is not desirable.

SUMMARY OF THE INVENTION

A controlled slew reference switch circuit is provided for limiting the phase deviation of a phase locked loop (PLL) output signal in response to the PLL switching between a plurality of input reference clock signals. The PLL includes a phase detector for measuring the phase deviation between two input signals. The controlled slew reference switch circuit includes a transfer function generator that controls one or more selector circuits for operating the PLL in a normal mode of operation and a holdover mode of operation. In the normal mode of operation the PLL is locked to one of the reference clock signals, and the phase detector inputs are coupled to the reference clock signal and a PLL feedback signal. In the holdover mode of operation both inputs of the phase detector are coupled to the PLL feedback signal, thereby holding the PLL in its last operational state. By controlling the amount of time that the PLL operates in the holdover mode versus the normal mode of operation, the controlled slew reference switch circuit controls the gain of the PLL and thereby limits the phase deviation of the PLL output signal.

According to one aspect of the invention, a circuit is provided for controlling the phase deviation in a PLL output signal when a reference signal input to the PLL is switched between a first reference signal and a second reference signal. The circuit preferably includes: (1) a first selector for routing either the reference signal or a feedback signal to the PLL in response to a control signal; and (2) a transfer function generator for generating the control signal, wherein the control signal causes the first selector to switch between the reference clock signal and the feedback signal according to a predetermined transfer function in order to modulate the gain of the PLL and thereby control the phase deviation of the PLL output signal.

According to another aspect of the invention, a phased lock loop (PLL) circuit for locking onto either a primary input reference clock signal or a backup input reference clock signal is provided. The PLL includes: (1) a first switch for selecting a reference signal from one of the primary input reference clock signal or the backup input reference clock signal; (2) a phase detector having a pair of inputs for discriminating the phase difference between the two signals at the pair of inputs and for generating a corresponding phase pulse output; (3) an integrator coupled to the phase pulse output for generating a phase voltage; (4) a voltage controlled oscillator coupled to the phase voltage for generating a local oscillator signal that is synchronized to the reference clock signal; (5) a feedback circuit including a counter coupled to the local oscillator signal for generating a feedback signal; and (6) a controlled slew reference switch coupled between the first switch and the phase detector for controlling the gain of the PLL by switching the PLL between a normal mode of operation in which the reference signal and the feedback signal are coupled to the inputs of the phase detector and a holdover mode of operation in which the feedback signal is coupled to both inputs of the phase detector.

Still another aspect of the invention provides a phase locked loop for generating a synchronized output signal in response to a reference clock signal and a feedback signal, wherein the phase locked loop includes a controlled slew reference switch for selecting the reference clock signal from a plurality of external reference clocks and for controlling the phase deviation in the synchronized output signal by switching the phase locked loop between a normal mode of operation in which the phase locked loop is locked onto the reference clock signal and a holdover mode of operation in which the phase locked loop is held in a prior operational state.

Another aspect of the invention provides a phase locked loop (PLL), comprising: (1) a switch for selecting a primary reference clock signal or a backup reference clock signal and for outputting a selected reference clock; (2) a synchronization loop comprising a phase detector, a voltage controlled oscillator coupled to the phase detector for generating an output clock signal, and a feedback counter coupled between the voltage controlled oscillator and the phase detector for generating a feedback signal from the output clock signal; and (3) a PLL gain controller coupled to the switch and the synchronization loop for signaling the switch to select the primary reference clock signal or the backup reference clock signal and for switching the synchronization loop between a normal mode of operation in which the synchronization loop is locked onto the selected reference clock and a holdover mode of operation in which the synchronization loop is held in a prior operational state in order to control the gain of the synchronization loop.

Still another aspect of the invention relates to an improved phase locked loop of the type having a phase detector coupled to a reference clock signal and a feedback signal, a voltage controlled oscillator coupled to the phase detector for generating a synchronized output signal, and a feedback counter coupled to the synchronized output signal for generating the feedback signal. The improvement provides a controlled slew reference switch for switching the phase locked loop between a normal mode of operation in which the loop is locked to the reference clock signal and a holdover mode of operation in which the loop is held in a prior operational state, wherein the controlled slew reference switch switches the PLL between the normal mode of operation and the holdover mode of operation according to a transfer function in order to control the phase deviation of the synchronized output signal It should be noted that these are just some of the many aspects of the present invention. Other aspects not specified will become apparent upon reading the detailed description of the drawings set forth below.

DETAILED DESCRIPTION OF THE DRAWINGS

Figure 1:
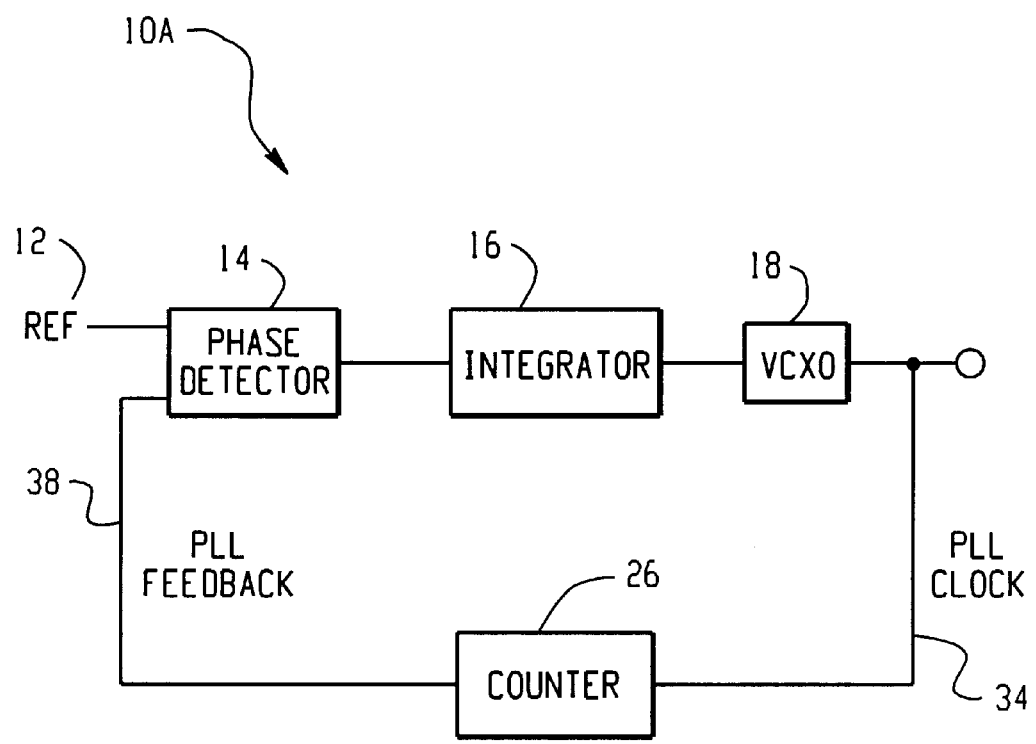
FIG. 1 is a circuit diagram of a known PLL.
Figure 2:
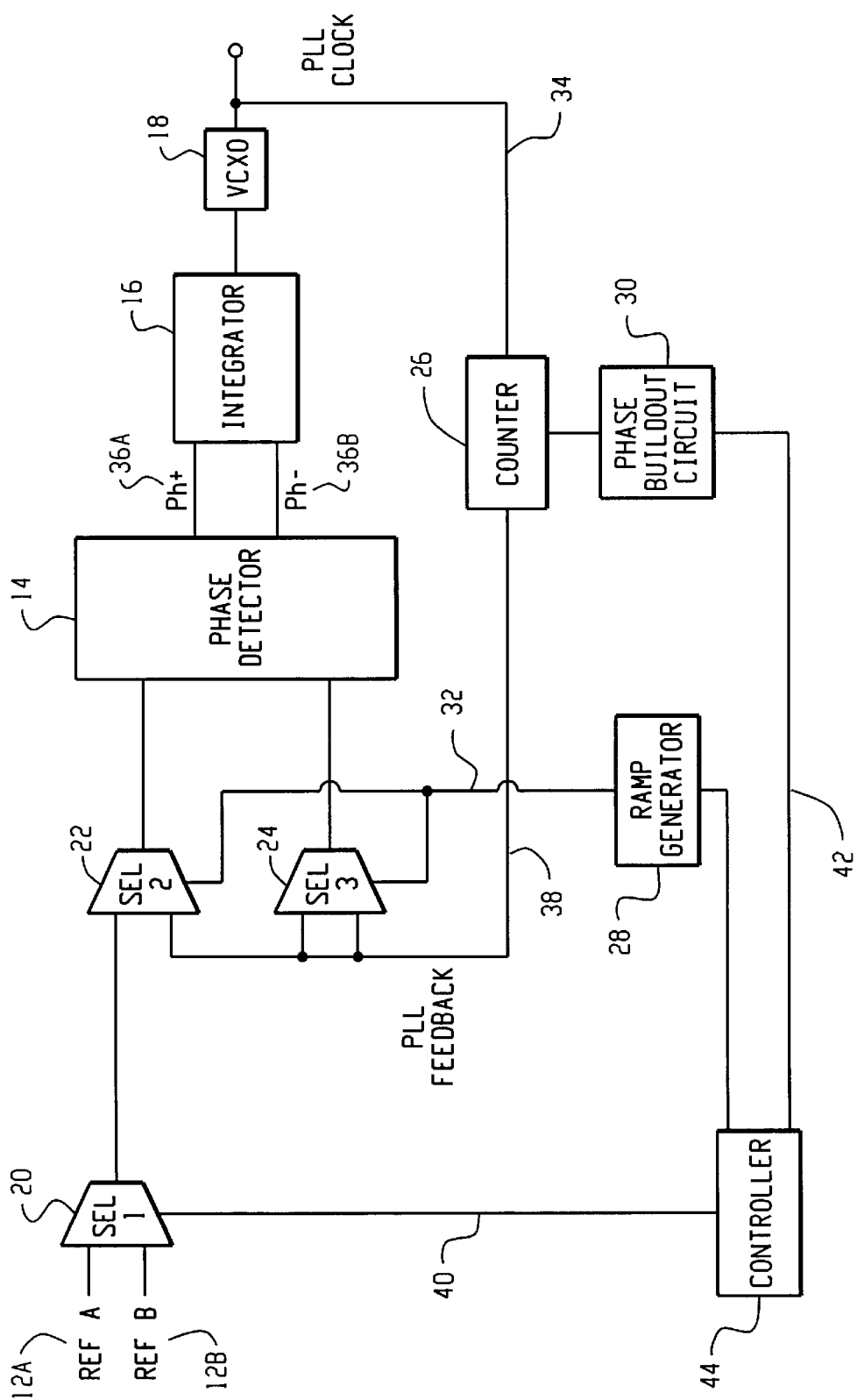
FIG. 2 is a circuit diagram of a PLL having a controlled slew reference switch circuit according to the present invention.

Turning now to the remaining drawing figures, FIG. 2 is a circuit diagram of a PLL having a controlled slew reference switch circuit according to the present invention. Similar to the PLL shown in FIG. 1, this circuit includes a phase detector 14, which is preferably a digital phase frequency detector that generates a pair of outputs (Ph+ 36A, Ph− 36B) in response to a detected phase deviation at its two inputs, an integrator 16, a voltage controlled oscillator (VCXO) 18, which generates the localized oscillator signal (PLL Clock) 34, and a feedback counter 26, which generates the PLL feedback signal 38. These portions of the circuit shown in FIG. 2 operate identically to that described above with reference to FIG. 1.

Also shown in FIG. 2 is a preferred embodiment of a controlled slew reference switch circuit, according to the present invention. This circuit includes a first selector switch 20, a second selector switch 22, a third selector switch 24, a digital controller 26, a ramp generator 28, and a phase buildout circuit 30.

The first selector switch 20 has two inputs coupled to the primary input reference clock signal 12A (REF A) and the backup input reference clock signal 12B (REF B), and an output (the selected reference clock signal) that is coupled to one input of the second selector switch 22. The first selector switch 20 is controlled by a first selector signal 40 from the digital controller 44, which causes the first selector switch 20 to select and route either the primary input reference clock signal 12A or the backup input reference clock signal 12B to its output.

The second selector switch 22 has two inputs, a first input that is coupled to the output of the first selector switch 20, and a second input that is coupled to the PLL feedback signal 38 from the counter 26. The output of the second selector switch 22 is coupled to one input of the phase detector 14.

The third selector switch 24 also has two inputs, both of which are coupled to the PLL feedback signal 38. The output of the third selector switch 24 is coupled to the other input of the phase detector 14. The purpose of the third selector switch 24, which always selects the PLL feedback signal 38 regardless of its control input, is to match the delay associated with the two inputs of the phase detector 14.

Both the second and third selector switches 22, 24 are controlled by a second selector signal 32 from the ramp generator 28. The ramp generator 28 preferably includes a plurality of counters that are configured to generate a series of digital pulses that correspond to an equivalent analog ramp function. The ramp generator 28 is, in turn, controlled by the digital controller 44, which can control the type and characterization of the transfer function output on the second selector line 32. Although a ramp function is preferably output on the second selector line 32, other types of transfer functions could also be utilized with the present invention, such as parabolic functions and other non-linear or linear transfer functions.

The phase buildout circuit 30 is coupled between the digital controller 44 and the feedback counter 26. It receives a force buildout command 42 from the digital controller 44 and causes the counter 26 to re-align the PLL feedback signal 38 to the new reference clock signal after a switch-over occurs. This forced realignment by the phase buildout circuit 30 minimizes the amount of phase correction required by the phase detector 14 after a switch-over, thereby further minimizing the phase deviation in the PLL clock signal 34.

The elements of the controlled slew reference switch circuit 20, 22, 24, 28, 30 and 44 operate together to control the slewing (or rate of change) in the phase deviation of the PLL cock signal 34 in response to a switch-over from one of the reference clock signals 12A, 12B to the other. To accomplish this control function, the controlled slew reference switch circuit alternately operates the PLL in two modes—the normal mode and the holdover mode.

In the normal mode of operation, the controller 44 selects one of the reference clock signals 12A, 12B via the first selector signal to, and the ramp generator 28 outputs a signal 32 to the second selector circuit 22 that selects the output of the first selector circuit 20. The third selector circuit always selects the PLL feedback signal 38 regardless of the signal 32. In this mode of operation, the PLL will detect any phase difference between the input reference clock signal 12A, 12B and the PLL feedback signal 38, and will generate phase correction pulses 36A, 36B (Ph+, Ph−) in order to correct the phase difference and lock the loop to the reference clock signal.

In the holdover mode of operation, the controller 44 still selects one of the reference clock signals 12A, 12B via the first selector signal 40, although this selection is somewhat irrelevant since the ramp generator 28 outputs a signal 32 to the second selector circuit 32 that selects the PLL feedback signal 38. Thus, both the second and third selector circuits 22, 24 are configured to select the PLL feedback signal 38 in this mode. This essentially freezes, or holds, the VCXO 18 in its last operating state, since there is no phase deviation between the two inputs of the phase detector 14, and thus there should be no change in the phase voltage output from the integrator 16. Even though the inputs to the phase detector 14 are the same, they can never be perfectly identical, and thus the phase detector 14 will still output some minimal phase correction pulses when in the holdover mode of operation.

By switching between these two modes of operation, the normal mode and the holdover mode, the controlled slew reference circuit can precisely control the phase deviation of the PLL clock output signal 34. This is accomplished by applying a ramp function (or some other transfer function) to the second selector circuit 22 to alternately switch the PLL between the normal mode (when the reference clock is selected) and the holdover mode (when the PLL feedback signal 38 is selected.) As noted above, this ramp function preferably comprises a plurality of digital pulse signals that correspond to an analog ramp. By switching the PLL between these two modes of operation, the gain of the PLL can be precisely controlled, and by controlling the gain of the PLL, the phase deviation in the output signal 34 can thereby be controlled.

When the PLL is fixed in holdover mode, the gain of the loop has been effectively reduced by 100%. When the PLL is fixed in normal mode, the gain of the loop has been reduced by 0%. By applying the ramp function to the second selector circuit 22, however, the gain of the loop can be varied between 100% reduction and 0% reduction by varying the pulse train output 32 from the ramp generator.

Initially, just after the controller 44 performs the switch-over from one input reference signal to another 12A, 12B, the ramp generator 28 will output a signal to put the PLL in holdover mode, thus reducing the gain of the loop by 100%. Then, over some predetermined time period, the ramp generator 28 will output a train of digital pulses on its output line 32 that correspond to an analog ramp function. This digital ramp signal 32 has the effect of toggling the second selector switch 22 between the normal and holdover modes of operation over this predetermined period of time.

In the beginning portion of the ramp function, the PLL will be in holdover mode most of the time and only in the normal mode for a very brief period of time. As the ramp progresses, however, a point will be reached where half of the time the PLL is in holdover mode and half of the time the PLL is in normal mode. This point represents a 50% reduction in the PLL gain. As the ramp continues, the percentage of time that the PLL is in the normal mode versus the holdover mode will increase, and eventually the ramp will end and the PLL will be back in the normal mode and thus the PLL gain will be reduced by 0%. Controlling the PLL loop gain in this manner enables precise control over the slew-rate of the phase deviation in the output signal 34 without having to unnecessarily slow down the loop speed.

Figure 3B:
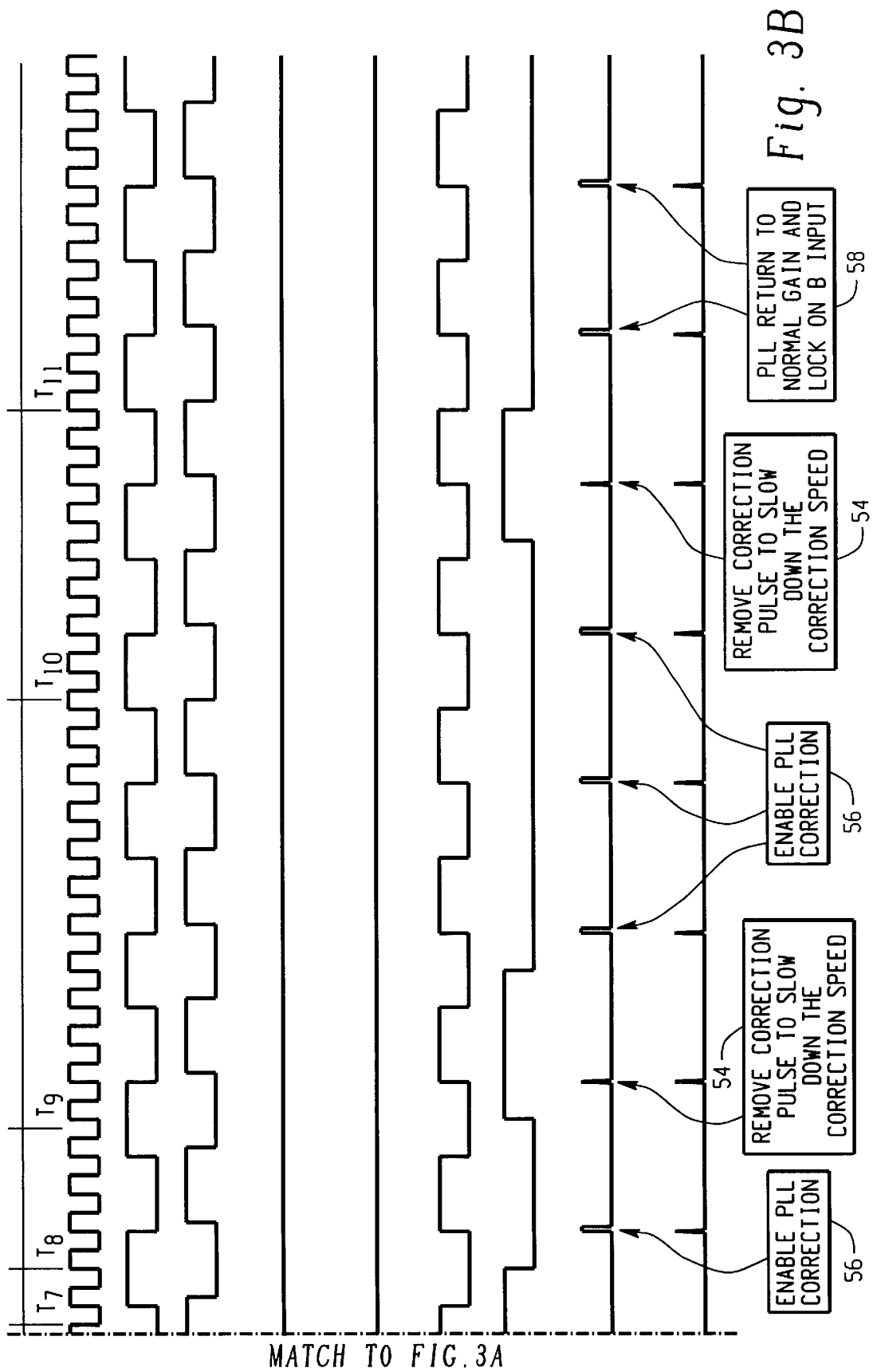
FIG. 3 is a timing diagram showing the operation of the circuit set forth in FIG. 2.

FIG. 3 is a timing diagram showing the operation of the circuit set forth in FIG. 2. This diagram shows the VCXO output clock signal 34, the primary input reference clock signal 12A, the backup input reference clock signal 12B, the switch-over command 40 from the controller 44, the force buildout command 42 from the controller 44, the PLL feedback signal 38, the ramp generator output signal 32, and the phase correction pulse outputs Ph+ 36A, Ph+ 36B from the phase detector 14.

At time T0 the PLL is locked to the REF A input 12A. The command signals from the controller 40, 42 and the output of the ramp generator 32 are each in the inactive state, which is preferably the low logic state. The PLL feedback signal 38 is synchronized to the REF A signal 12A, and the phase detector 14 outputs minimal-width pulses 50 on the pulse outputs 36A, 36B, indicating that the loop is locked. These minimal-width pulses 50 are always output from the phase detector 14 due to the fact that there is typically a phase discrimination dead-zone associated with the phase detector below which the phase detector 14 cannot discriminate the phase difference between its two inputs.

At time T1, the controller 44 puts the switch A/B command 40 into the active state, indicating a switch-over is required between the two reference clock signals 12A, 12B. Shortly thereafter, at time T2, the controller 44 activates the phase buildout circuit 30, which between time T2 and T3 adjusts the phase of the PLL feedback signal 38 so that the PLL feedback signal 38 is nearly in phase with the new reference clock signal, in this example, REF B 12B. At this point, time T3, the phase detector 14 then responds to the phase difference between the new reference clock signal 12B and the adjusted PLL feedback signal 38 by outputting a relatively narrow phase correction pulse 52.

By adjusting the PLL feedback 38 in this manner, the controller 44 can then precisely control the ramp generator 28 so that it only switches the second selector 22 during the period of time in which the reference clock signal 12B is in the low state. This is important because if the selector 22 is activated during the period of time when the reference clock signal is high, a transitional correction pulse will be output from the phase detector 14 that could destabilize the loop. Because the buildout circuit has positioned the PLL feedback signal 38 very close in phase to the reference clock signal, however, the controller can examine the feedback signal 38 to know when to activate the selector 22.

At time T4, the PLL feedback 38 is low, and thus the controller 44 can activate the ramp generator with confidence that the reference clock input 12B is also in the low state. Once activated, the ramp generator 28 outputs an initial digital pulse corresponding to the beginning of the ramp function. During the time period T4–T5 where the ramp generator output is high, the PLL is in the holdover mode where both of the selector circuits 22, 24 are selecting the PLL feedback signal 38. Thus, during this holdover period T4–T5, the phase detector 14 will not output any correction pulses (which it normally would if the PLL was in the normal mode), but instead the phase detector 14 outputs the minimal-width pulses 54 corresponding to the fact that the two inputs to the phase detector 14 are nearly identical in phase.

At time T5, the output of the ramp generator 32 goes low, again during the time when the reference clock signal is low, and the PLL returns to the normal mode of operation. Thus, at 56 a correction pulse is again output from the phase detector 14 corresponding to the remaining phase deviation between the PLL clock signal 34 and the reference clock signal 12B. This pattern of switching from the holdover mode to the normal mode continues during time periods T6, T7, T8, T9, and T10, although as time progresses the amount of time that the PLL is in the holdover mode decreases and the amount of time that the PLL is in the normal mode increases. This action corresponds to the gain of the PLL being increased from 100% reduced to 0% reduced. Finally, at T11, the ramp ends and the PLL is locked onto the new reference signal 12B. The PLL is then fixed in the normal mode of operation 58 until the next switch-over occurs.

It should be noted that FIG. 3 shows a very compressed time scale for the ramp function for illustrative purposes only in which the ramp lasts for only several time periods. Under true operating conditions, the digital ramp may last for hundreds or even thousands of time periods over which the PLL gain would slowly vary from 100% reduced to 0% reduced.

Figure 4:
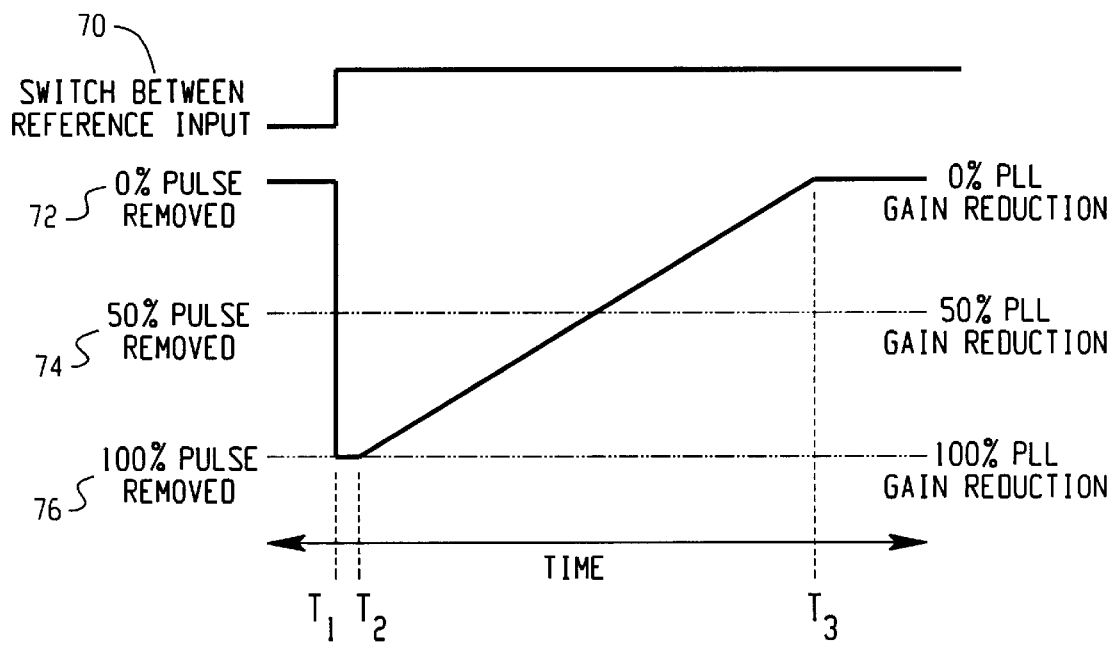
FIG. 4 is a timing diagram showing the percentage gain reduction of the PLL in response to a ramp signal from the controlled slew reference switch circuit of the present invention in which the ramp begins immediately after the switchover.

FIG. 4 is a timing diagram showing the percentage gain reduction of the PLL in response to a ramp signal from the controlled slew reference switch circuit of the present invention in which the ramp begins immediately after the switch-over. Trace 70 shows the switch-over time.

Prior to the switch-over, at time T1, the gain of the PLL is 0% reduced, meaning that the loop is fixed in the normal mode of operation. At time T2, the switch-over is activated, and the gain is reduced past 50% 74 to 100% 76. The 100% reduced condition 76 corresponds to the PLL being fixed in the holdover mode. Almost immediately after the reduction to 100% reduced, the ramp generator 32 then outputs a train of digital pulses corresponding to the analog ramp function shown in FIG. 4. This train of digital pulses causes the second selector circuit 22 to toggle between the normal mode of operation and the holdover mode of operation in proportion to the degree of gain reduction required. For example, when the ramp function indicates that the gain should be 90% reduced, the ramp generator 28 will output a train of digital pulses that causes the PLL to be in the holdover mode 90% of the time and the normal mode just 10% of the time. As the ramp continues to rise to 50% and then ultimately 0%, the percentage of time that the PLL is in the two modes correspondingly changes. Because of imperfections in the integrator circuit, it is preferable to utilize a ramp function that is five to ten times slower than the PLL loop speed.

Figure 5:
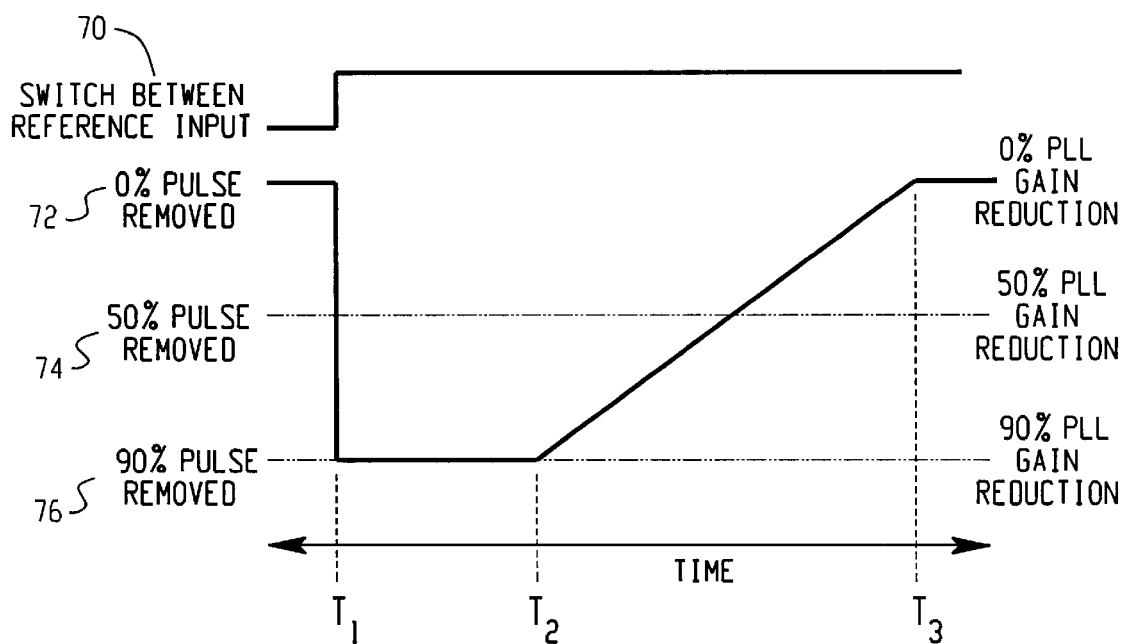
FIG. 5 is a timing diagram showing the percentage gain reduction of the PLL in response to a ramp signal from the controlled slew reference switch circuit of the present invention in which the ramp begins some time period after the switch-over.

FIG. 5 is a timing diagram showing the percentage gain reduction of the PLL in response to a ramp signal from the controlled slew reference switch circuit of the present invention in which the ramp begins some time period after the switch-over. The transfer function shown in FIG. 5, which is characterized by an extended period of time in which the PLL is 90% gain reduced, followed by a ramp up to 0%, enables the PLL to lock in a more controlled manner. The time at which the ramp up begins should coincide with the point where the phase detector output is zero degrees. A zero-crossing circuit can be used to monitor this point. If the ramp begins immediately, as shown in FIG. 4, then the PLL may lock too quickly. Although FIGS. 4 and 5 show two forms of ramp functions, alternatively other types of linear and non-linear transfer functions for altering the gain of the PLL, and thus altering the switching from the normal to the holdover modes of operation, could be implemented with the present invention.

The preferred embodiment described with reference to the drawing figures is presented only to demonstrate an example of the invention. This detailed description is not meant to limit the invention in any way. Additional, and/or alternative, embodiments of the invention would be apparent to one of ordinary skill in the art upon reading this disclosure.

What is claimed:

1. A circuit for controlling the phase deviation in an output signal from a phase locked loop (PLL) that occurs when a reference signal input to the PLL is switched between a first reference signal and a second reference signal, comprising:
  a reference signal switch for switching between the first reference signal and the second reference signal to generate the reference signal input;
  a first selector for routing either the reference signal or a feedback signal to the PLL in response to a control signal, wherein the feedback signal is a frequency divided version of the PLL output signal; and
  a transfer function generator for generating the control signal, wherein the control signal causes the first selector to switch between the reference clock signal and the feedback signal according to a predetermined transfer function in order to modulate the gain of the PLL and thereby control the phase deviation of the PLL output signal.

2. The circuit of claim 1, further comprising:
  a second selector having two inputs coupled to the feedback signal for routing the feedback signal to the PLL in response to the control signal.

3. The circuit of claim 1, wherein the transfer function generator is a ramp generator.

4. The circuit of claim 1, further comprising:
a controller coupled to the reference signal switch for selecting the first reference signal or the second reference signal as the reference signal input; and
a phase buildout circuit coupled to the controller and the PLL for altering the phase of the feedback signal in response to the controller causing the reference signal switch to switch between the first reference signal and the second reference signal.

5. The circuit of claim 1, further comprising:
a controller for selecting the first reference signal or the second reference signal and for controlling the operation of the transfer function generator.

6. The circuit of claim 1, wherein the transfer function is a non-linear function.

7. The circuit of claim 1, wherein the control signal is a train of digital pulses that correspond to an analog transfer function.

8. The circuit of claim 1, wherein the circuit causes the PLL to operate in two modes, a normal mode of operation when the selector routes the reference signal to the PLL, and a holdover mode of operation when the selector routes the feedback signal to the PLL.

9. The circuit of claim 8, wherein the gain of the PLL is controlled by controlling the amount of time that the PLL is in the holdover mode versus the normal mode.

10. The circuit of claim 9, wherein the gain of the PLL is reduced in proportion to the amount of time that the PLL is in the holdover mode versus the normal mode.

11. A phased lock loop (PLL) circuit for locking onto either a primary input reference clock signal or a backup input reference clock signal, the PLL circuit comprising:
a first switch for generating a reference clock signal by selecting either the primary input reference clock signal or the backup input reference clock signal;
a phase detector having a pair of inputs for discriminating the phase difference between the two signals at the pair of inputs and for generating a corresponding phase pulse output;
an integrator coupled to the phase pulse output for generating a phase voltage;
a voltage controlled oscillator coupled to the phase voltage for generating a local oscillator signal that is synchronized to the reference clock signal;
a feedback circuit including a counter coupled to the local oscillator signal for generating a feedback signal, wherein the feedback signal is a frequency divided version of the local oscillator signal; and
a controlled slew reference switch coupled between the first switch and the phase detector for controlling the gain of the PLL by switching the PLL between a normal mode of operation in which the reference clock signal and the feedback signal are coupled to the inputs of the phase detector and a holdover mode of operation in which the feedback signal is coupled to both inputs of the phase detector.

12. The PLL circuit of claim 11, wherein the controlled slew reference switch comprises:
a transfer function generator and a pair of selector circuits, wherein the transfer function generator applies a digital transfer function to the control inputs of the selector circuits in order to switch the selector circuits.

13. The PLL circuit of claim 11, wherein the PLL circuit is integrated into a telecommunications network element.

14. The PLL circuit of claim 13, wherein the telecommunications network element is an add-drop multiplexer.

15. The PLL circuit of claim 11, wherein the controlled slew reference switch includes a transfer function generator and a controller for controlling the slew rate of the phase deviation in the local oscillator signal by applying a predetermined transfer function to the first switch.

16. The PLL circuit of claim 15, wherein the predetermined transfer function is variable.

17. The PLL circuit of claim 15, wherein the predetermined transfer function is a ramp function.

18. The PLL circuit of claim 15, wherein the predetermined transfer function is a parabolic function.

19. A phase locked loop for generating a synchronized output signal in response to a reference clock signal and a feedback signal, the phased lock loop comprising:
a controlled slew reference switch for selecting the reference clock signal from a plurality of external reference clocks and for controlling the phase deviation in the synchronized output signal by switching the phase locked loop between a normal mode of operation in which the phase output signal of the locked loop is locked onto the reference clock signal and a holdover mode of operation in which the out signal of the phase locked loop is locked onto the feedback signal.

20. The phase locked loop of claim 19, wherein the controlled slew reference switch includes a transfer function generator that switches the PLL between the normal mode of operation and the holdover mode of operation according to a transfer function.

21. The phase locked loop of claim 20, wherein the transfer function is a ramp function.

22. A phase locked loop (PLL), comprising:
a first switch for selecting a primary reference clock signal or a backup reference clock signal and for outputting a selected reference clock;
a synchronization loop comprising a phase detector, a voltage controlled oscillator coupled to the phase detector for generating an output clock signal, and a feedback counter coupled between the voltage controlled oscillator and the phase detector for generating a feedback signal from the output clock signal; and
a PLL gain controller coupled to the first switch and the synchronization loop for signaling the switch to select the primary reference clock signal or the backup reference clock signal and for switching the synchronization loop between a normal mode of operation in which the synchronization loop is locked onto the selected reference clock and a holdover mode of operation in which the synchronization loop is locked onto the feedback signal in order to control the gain of the synchronization loop.

* * * * *

UNITED STATES PATENT AND TRADEMARK OFFICE
CERTIFICATE OF CORRECTION

PATENT NO. : 6,362,670 B1  
DATED : March 26, 2002  
INVENTOR(S) : Bealiieu

It is certified that error appears in the above-identified patent and that said Letters Patent is hereby corrected as shown below:

<u>Column 10,</u>
Line 31, delete "out" insert -- output --

Signed and Sealed this

Eighteenth Day of June, 2002

*Attest:*

JAMES E. ROGAN
*Attesting Officer*  *Director of the United States Patent and Trademark Office*